United States Patent [19]

Cordts et al.

[11] 4,093,768

[45] June 6, 1978

[54] COPPER FOIL ELECTRICAL LAMINATE WITH REINFORCED PLASTICS

[75] Inventors: Howard P. Cordts, Grafton; Robert F. Navin; R. Charles Ross, both of Port Washington, all of Wis.

[73] Assignee: Freeman Chemical Corporation, Port Washington, Wis.

[21] Appl. No.: 659,480

[22] Filed: Feb. 19, 1976

[51] Int. Cl.$^2$ .................. B32B 15/08; B32B 15/20; B32B 15/14

[52] U.S. Cl. .................. 428/287; 428/395; 428/430; 428/433; 428/458; 428/901; 427/96; 156/308

[58] Field of Search ............ 428/433, 287, 430, 395, 428/458, 901

[56] References Cited

U.S. PATENT DOCUMENTS

| | | | |
|---|---|---|---|
| 2,258,708 | 10/1941 | Langkammerer | 428/430 |
| 2,698,991 | 1/1955 | Mesick, Jr. | 428/433 V |
| 2,830,000 | 4/1958 | Labino | 428/433 X |
| 3,944,449 | 3/1976 | Caule | 428/458 |

*Primary Examiner*—P. C. Ives
*Attorney, Agent, or Firm*—Harry B. Keck; George E. Manias

[57] ABSTRACT

Laminates of reinforced plastics and copper foil are prepared with a small quantity of benzotriazole in the plastic ingredient. The resulting laminate has excellent bond between the plastic and the copper foil and hence can be employed as an electrical circuit board.

3 Claims, No Drawings

COPPER FOIL ELECTRICAL LAMINATE WITH REINFORCED PLASTICS

BACKGROUND OF THE INVENTION

1. Field of the Invention

The invention relates to electrical laminates fabricated from copper sheets and reinforced thermosetting resins.

2. Description of the Prior Art

Electrical circuit boards are prepared by combining copper sheets or copper alloy sheets with sheets of lightweight electrical insulating materials such as glass fiber reinforced unsaturated polyester resin sheets. The electrical circuit board may have a sheet of copper foil on one side only or on both sides of the laminate.

A test for determining the peel strength of copper foil from electrical circuit boards has been established by National Electrical Manufacturers' Association, Test LI 1-10.14. Normally the copper foil is secured to the reinforced plastic sheet by means of a suitable adhesive. Attempts to cure an unsaturated polyester resin directly on a copper foil heretofore have not produced a resulting laminate with sufficient peel strength.

Benzotriazole has been employed in unsaturated polyester resin compositions which have been used to encapsulate electrical components.

SUMMARY OF THE INVENTION

A sheet of copper or copper alloy foil is placed in a flat mold. Continuous strand glass fibers are applied on top of the copper foil. Unsaturated polyester resin syrup containing up to about 2% of its weight benzotriazole is applied to the glass fibers. The resulting laminate is pressed at elevated temperature between flat plates until the unsaturated polyester resin syrup is cured. The unsaturated polyester resin syrup normally will contain an initiator of polymerization, e.g., t-butyl perbenzoate. If a double foil laminate is desired, a second sheet of copper or copper alloy foil is applied to the top of the glass fibers and resin prior to pressing.

DESCRIPTION OF THE PREFERRED EMBODIMENT(S)

The present copper clad laminates comprise glass fiber reinforced polyester resin sheets directly adhered to a copper or copper alloy foil on one or both surfaces without extrinsic adhesives.

Copper or Copper Alloy Foil

Electrical circuit boards employ a copper or copper alloy foil which is subsequently etched away to leave behind portions of the copper foil as electrical conductors. The copper foil thickness is measured in terms of the number of ounces of copper or copper alloy per square foot of the foil. Customarily electrical circuit boards employ foil having one ounce per square foot or two ounces per square foot thicknesses. One surface of the copper foil preferably has a surface roughness against which the polyester resin is molded. The other surface of the foil customarily is shiny bright.

Unsaturated Polyester Resin

Polymerizable unsaturated polyester resins are fabricated by polyesterification of polyhydric alcohols and polycarboxylic acids or anhydrides, at least a portion of which include ethylenically unsaturated carboxylic acids or anhydrides. The resulting polyesters are cooked to a relatively low acid value and are combined with ethylenically unsaturated copolymerizable monomers, such as styrene, to produce an unsaturated polyester resin syrup which can be cured by the addition of suitable free radical initiators, such as t-butyl perbenzoate. Customarily the unsaturated polyester resin is filled with suitable inert particulate materials such as powdered alumina hydrate. If desired a suitable mold release agent such as zinc stearate may be included in the formulation as a mold release agent. Preferably the mold release agent is not employed because it interferes with the adhesion of the copper foil. Instead it is preferred to use coated mold release paper to achieve the desired mold release character.

Benzotriazole

A small quantity of benzotriazole, up to about 2% by weight of the unsaturated polyester resin syrup, is included in the composition.

EXAMPLE 1

An unsaturated polyester resin was prepared by combining 1.0 mols isophthalic acid, 2.0 mols maleic anhydride, and 3.15 mols propylene glycol. 3 parts by weight of that unsaturated polyester resin was combined with 1 part by weight monomeric styrene to produce an unsaturated polyester resin syrup, I.

EXAMPLE 2

54 parts by weight of resin syrup I was combined with 6 parts by weight styrene, 40 parts by weight powdered alumina hydrate, 2 parts by weight zinc stearate and 0.6 parts by weight tertiary butyl perbenzoate. This composition was identified as unsaturated polyester resin paste A.

A further unsaturated polyester resin paste B was prepared by combining 0.36 parts by weight benzotriazole into the polyester resin paste A.

EXAMPLE 3

Copper clad laminates were prepared from resin paste A and resin paste B. Pure copper foil, 2 ounces per square foot thickness, was placed in the bottom of a press. Two plies of randomly oriented glass fiber mat, 2 ounces per square foot, especially purified for use in electrical laminates were placed on top of the copper foil in the press. The glass fiber mats were wetted with sufficient of the resin paste to produce laminates having a final thickness of ⅛-inch. The press was closed for 2½ minutes at 310° F.

The resulting laminates were tested for copper peel strength according to NEMA Test LI 1-10.14 with the following results. The laminates from resin paste A had a copper peel strength of 5.0 pounds per inch whereas the laminates prepared from resin paste B had a peel strength of 7.5 pounds per inch when tested in one facility and 8.7 pounds per inch when tested in a different facility.

The laminates from resin paste A and resin paste B exhibited no blisters when exposed to molten electrical solder.

We claim:

1. A copper foil electrical laminate comprising a sheet of copper or copper alloy foil directly bonded to glass fiber reinforced unsaturated polyester resin containing up to about 2% by weight, based on the unsaturated polyester resin syrup of benzotriazole incorporated in said resin prior to curing of said resin.

2. The laminate of claim 1 wherein two copper or copper alloy foils are employed as the outer surfaces and an inner core of the glass fiber reinforced unsaturated polyester resin is presented.

3. The electrical laminate of claim 1 wherein the said unsaturated polyester resin is the reaction product of polyhydric alcohol and dicarboxylic acids consisting essentially of isophthalic acid and maleic anhydride.

* * * * *